United States Patent [19]

Khomich et al.

[11] 4,187,084

[45] Feb. 5, 1980

[54] FERROMAGNETIC ABRASIVE MATERIAL AND METHOD FOR PREPARING THE SAME

[76] Inventors: Nikolai S. Khomich, ulitska Karbysheva, 11, kv. 10; Faddei J. Sakulevich, pereulok Dalny, 3, both of Minsk; Boris N. Putimtsev, shosse Entuziastov, 111, kv. 71, Moscow; Vladimir A. Silaev, stantsia Redkino, prospekt Khimikov, 36, kv. 14, Kalininskaya oblast, all of U.S.S.R.

[21] Appl. No.: 921,730

[22] Filed: Jul. 3, 1978

[51] Int. Cl.$^2$ .......................................... B29C 23/00
[52] U.S. Cl. ........................................ 51/308; 51/309; 264/12; 427/216; 51/DIG. 30
[58] Field of Search .................... 264/12; 51/309, 308, 51/DIG. 30; 427/217, 215, 216, 219

[56] References Cited

U.S. PATENT DOCUMENTS

| 2,878,518 | 3/1959 | Klee | 264/12 |
| 3,243,288 | 3/1966 | Feldmann et al. | 264/12 |
| 3,471,595 | 10/1969 | Feldmann et al. | 264/12 |

FOREIGN PATENT DOCUMENTS

| 234184 | 8/1969 | U.S.S.R. | 51/309 |
| 476970 | 10/1975 | U.S.S.R. | 51/309 |
| 500975 | 10/1976 | U.S.S.R. | 51/309 |

*Primary Examiner*—Donald J. Arnold
*Attorney, Agent, or Firm*—Fleit & Jacobson

[57] ABSTRACT

A ferromagnetic abrasive material containing a ferromagnetic component including an iron-aluminum-silicon-phosphorus-carbon alloy and an abrasive component including aluminum and silicon oxides, carbides, nitrides and phosphides, the ingredients being used in the following proportions (in % by weight):

| iron | 75–97 |
| aluminum | 0.2–16.0 |
| silicon | 0.2–18.0 |
| phosphorus | 0.005–1.5 |
| carbon | 0.005–4.0 |
| oxygen | 0.05–3.0 |
| nitrogen | 0.01–0.5 |
| including oxides, carbides, nitrides and phosphides | 0.01–5.0. |

A method for preparing said ferromagnetic abrasive material comprises melting an iron-aluminum-silicon-phosphorus alloy, adding carbon to the resultant melt and subsequently overheating the melt containing iron, aluminum, silicon, phosphorus, carbon above the temperature corresponding to the beginning of solidification by 50°–200° C. Then a jet of the melt Fe—Al—Si—P—C is atomized to obtain pellets of a size smaller than 1.5 mm with a gas jet at a pressure from 2 to 20 atm. and gas velocity from 150 to 500 m/s, the gas jet containing from 99.999 to 75% by weight of nitrogen and from 0.001 to 25% by weight of oxygen. The resultant pellets are cooled.

7 Claims, No Drawings

FERROMAGNETIC ABRASIVE MATERIAL AND METHOD FOR PREPARING THE SAME

The invention relates to abrasive materials and more particularly to a ferromagnetic abrasive material for an abrasive treatment of workpiece surfaces in a magnetic field, and to a method for preparing such material.

The invention may be most advantageously used for cleaning blanks of printed circuits with ferromagnetic abrasive powders in a magnetic field, for decorative polishing of workpiece surfaces in a magnetic field and in applications where low roughness values ($R_a$ from 2.5 to 0.02 μm) are to be obtained for surfaces of workpieces made of various materials.

The intensity and efficiency of abrasive treatment in a magnetic field depend to a large extent on the cutting capacity of the ferromagnetic abrasive material used. The cutting capacity of known materials is negatively affected by their poor magnetic properties, low strength of bond between the ferromagnetic and abrasive components within pellets and low hardness of the abrasive component. In using known ferromagnetic abrasive materials for abrasive treatment in a magnetic field, purely mechanical, diffusion and adhesive saturation of the surface layer of workpieces with extraneous inclusions occurs. The shape and structure of pellets of such ferromagnetic abrasive materials are not optimal, they limit the capabilities of the abrasive treatment in a magnetic field and fail to ensure, over a wide range, a desired microrelief of the surface and quality of the surface layer of workpieces being formed.

One of the prior art ferromagnetic abrasive materials contains a ferromagnetic component in the form of 80–70% by weight of technical iron and an abrasive component in the form of 20–30% by weight of electrolytically produced corundum. For the preparation of this material, iron and electrolytically produced corundum in pulverulent form are mixed together in the above-mentioned proportions to obtain a uniform distribution of the components over the entire volume of the mixture. The resultant mixture is pressed, sintered at high temperature and mechanically crushed. During sintering iron partially melts and envelops the grains of electrolytically produced corundum, thus ensuring the mechanical binding of the components within the pellets. Since the components—iron and electrolytically produced corundum—do not chemically react, the strength of their mechanical bond in pellets is low, and, where the material is used for an abrasive treatment of workpieces in a magnetic field, particles of electrolytically produced corundum are forced out of the iron base of pellets, and the material rapidly looses its cutting capacity.

Another prior art ferromagnetic abrasive material contains a ferromagnetic component in the form of 70–80% by weight of iron and an abrasive component in the form of 20–30% by weight of ferromanganese containing 20–75% by weight of manganese. The method of preparing this material is similar to that described above. In this method a eutectic is formed at the point of contact of ferromanganese and iron, there is a chemical bond between the components and high strength of bond. However, low microhardness of ferromanganese (maximum 1200 kg/mm$^2$) negatively affects the cutting capacity of the material as a whole.

Known in the art are also ferromagnetic abrasive materials containing 70–85% by weight of iron as ferromagnetic component and 30–15% by weight of transition metal carbides (such as Ti, W, Zr, Cr, Mo, V carbides) as abrasive component. These materials are also made as described above. Carbides of the above-mentioned metals exhibit high microhardness (up to 3000 kg/mm$^2$) and form eutectic and chemical bond with iron at high temperature. These carbides contain, however, an increased quantity of free carbon (up to 3% by weight) which contaminates the workpiece surface being treated during an abrasive treatment in a magnetic field.

A general disadvantage of all prior art ferromagnetic abrasive materials resides in a relatively low cutting capacity due to low magnetic properties, since pellets of such materials contain from 15 to 30% by weight of a diamagnetic abrasive component.

The structure of pellets is identical for all the above-described ferromagnetic abrasive materials: particles of an abrasive component are uniformly distributed over the iron base. Where such materials are used for an abrasive treatment in a magnetic field each pellet comes in contact with the workpiece surface being teated either with the iron base side or with the abrasive particle. As it follows from the ratio between the ferromagnetic and abrasive components in the materials, the probability of contact of the workpiece surface being treated with the iron base of the pellet is on the average four times greater than the probability of contact with the abrasive particle of the pellet. This defines an important general disadvantage of all prior art abrasive materials residing in a trend to mechanical, adhesive and diffusion saturation of the surface layer of a workpiece with iron and carbon from the ferromagnetic base of pellets when using such materials for an abrasive treatment of workpieces in a magnetic field.

Pellets of all prior art ferromagnetic abrasive materials acquire a nearly spherical shape during the preparation and have rounded edges. Such shape of pellets restricts the possibility of ensuring an optimal combination of desired characteristics of microrelief of the surface and stressed state of the surface layer of workpieces during their abrasive treatment in a magnetic field, over a wide range.

It is an object of the invention to provide a ferromagnetic abrasive material having high cutting capacity, improved magnetic properties, high hardness and strength.

Still another object of the invention is to improve a method for preparing powders by atomizing a metal melt with a gas jet so as to obtain pellets of a desired shape and pre-set composition of abrasive component.

With these and other objects in view, the invention resides in that in a ferromagnetic abrasive material containing a ferromagnetic component and an abrasive component, according to the invention, the ferromagnetic component includes an iron-aluminum-silicon-phosphorus-carbon alloy and the abrasive component includes aluminum and silicon oxides, carbides, nitrides and phosphides with the following proportions of the ingredients in % by weight:

| | |
|---|---|
| iron | 75–97 |
| aluminum | 0.2–16.0 |
| silicon | 0.2–18.0 |
| phosphorus | 0.005–1.5 |
| carbon | 0.005–4.0 |
| oxygen | 0.05–3.0 |
| nitrogen | 0.01–0.5 |

| | |
|---|---|
| including: oxides, carbides, nitrides and phosphides | 0.01–5.0 |

The ferromagnetic abrasive material according to the invention exhibits high magnetic properties $\mu_{H=600}$ $Oe = 7-12.1$ Gs/Oe which is 1.1–2.5 times greater than the respective index for prior art ferromagnetic abrasive materials.

The abrasive component exhibits high hardness (average microhardness 2200 kg/mm$^2$).

The strength of the material according to the invention may be influenced by varying the content of phosphorus, aluminum and silicon.

The above-mentioned positive properties define high cutting capacity of the ferromagnetic abrasive material. Its application for abrasive treatment of workpieces in a magnetic field enables the achievement of low values of roughness of the surface of workpieces ($R_a$ 0.1–0.02 $\mu$m) with the treatment time reduced by 1.5–3 times compared to prior art ferromagnetic abrasive materials.

Availability of starting products determines low cost of the ferromagnetic abrasive material which is 2–5 times cheaper than prior art materials.

The ferromagnetic abrasive material according to the invention exhibits chemical neutrality, low diffusion and adhesive capacity towards the surface being treated; no carbon saturation of the surface of a workpiece occurs during an abrasive treatment in a magnetic field as carbon is in the bound form as silicon and aluminium carbides.

The above object is also accomplished by that in a method for preparing a ferromagnetic abrasive material, comprising melting an iron-aluminum-silicon-phosphorus alloy and over-heating it above the temperature corresponding to the beginning of solidification by 50°–200° C., atomizing the melt jet to obtain pellets of a size smaller than 1.5 mm with a gas jet with subsequent cooling of the resultant pellets, according to the invention, carbon is added to the iron-aluminum-silicon-phosphorus melt, and the gas jet has a pressure of from 2 to 20 atm. and a velocity from 150 to 500 m/s and contains from 99.999 to 75% by weight of nitrogen (N$_2$) and from 0.001 to 25% by weight of oxygen (O$_2$) which form aluminum and silicon oxides and nitrides on the surface of pellets during the atomization of melt and cooling of pellets.

This method ensures the preparation of pellets in which the ferromagnetic component is disposed centrally thereof, and the abrasive component is disposed on the periphery of the ferromagnetic component. Moreover, by modifying the melt composition and atomization conditions, a pre-set shape of pellets may be varied over a large range: from spherical one to an elongate splinter-like shape. Thus, an increase in content of aluminum in the melt and reduction of gas velocity in the atomizing jet and nitrogen content thereof contributes to the formation of elongate splinter-shaped pellets, whereas an increase in silicon content of melt and a greater gas velocity in the atomizing jet and increased nitrogen content thereof contributes to the formation of nearly spherical pellets.

By varying the composition of the gas jet, the quantitative composition of nitrides and oxides in the abrasive component may be changed. By increasing the oxygen content in the gas jet, the resultant pellets will have a thicker layer of abrasive component and may be advantageously used for an abrasive treatment of hard-to-machine materials in a magnetic field. With an increase in the nitrogen content of the gas jet, the resultant pellets have a thin layer of the abrasive component, better magnetic properties and higher cutting capacity in an abrasive treatment of aluminum and its alloys in a magnetic field.

Two specific compositions of the ferromagnetic abrasive material according to the invention will be disclosed.

EXAMPLE 1

A ferromagnetic abrasive material according to the invention having the following composition (in % by weight): iron- 83.3; aluminum-8; silicon, 5; phosphorus- 0.1; carbon- 0.1; aluminum, and silicon carbides, nitrides and phosphides- 3.5 was used for an abrasive treatment of the surface of printed circuit blank in a magnetic field prior to the printed circuit application. The abrasive treatment resided to the removal of copper oxides film and to providing a pre-set microrelief of the surface for application of a coating, that is the printed circuit. Thus, the abrasive treatment in a magnetic field was conducted in the microcutting mode.

The pellets of the material were of an elongated splinter-like shape with acute-angle edges and small radii of spicies. As a result of the abrasive treatment in a magnetic field, a relatively thick layer of copper and its oxides was removed from the blank surface (2–20 $\mu$m). The microprofile of the resultant surface was characterized by comparatively small spacing of irregularities vis. their height, large angle of inclination of the sides of irregularities and small radii of indents and projections. This treatment ensured high quality of preparation of blanks for further production steps.

EXAMPLE 2

A ferromagnetic abrasive material according to the invention of the following composition (in % by weight): iron- 82.9; aluminum- 3; silicon- 9; phosphorus- 0.005; carbon- 0.005; aluminum and silicon carbides, nitrides and phosphides- 5.0 was used for polishing low-carbon steel in a magnetic field. The abrasive treatment resided in obtaining a surface roughness ($R_a$=0-.1–0.02 $\mu$m) with the removal of a small amount of metal from the workpiece surface. The abrasive treatment was conducted in the microironing mode. As a result of the treatment in a magnetic field protrusions were eliminated, plastic microdeformation of irregularities took place, the indents were filled with deformed metal and microrelief was smoothened.

The use of the ferromagnetic abrasive material according to the invention for an abrasive treatment in a magnetic field of workpieces of various materials ensures desired characteristics of microprofile of the treated surface within the following ranges:

| | |
|---|---|
| arithmetic mean deviation of the profile ($R_a$) | 2.5–0.02$\mu$m; |
| average spacing of irregularities (T) | 800–20$\mu$m; |
| average angle of inclination of the sides of irregularities (O) | 10°–0°15′ |

The distribution of the abrasive component over the surface of pellets and its chemical neutrality in all applications of the ferromagnetic abrasive material according to the invention practically eliminate contamination of workpiece surfaces being treated with extraneous inclusions.

We claim:

1. A ferromagnetic abrasive material containing:
   a ferromagnetic component including an iron-aluminum-silicon-phosphorus-carbon alloy; and
   an abrasive component including aluminum and silicon oxides, carbides, nitrides and phosphides;
   said ingredients being used in the following proportions (in % by weight):

| | |
|---|---|
| iron | 75–97 |
| aluminum | 0.2–16.0 |
| silicon | 0.2–18.0 |
| phosphorus | 0.005– 1.5 |
| carbon | 0.005– 4.0 |
| oxygen | 0.05 – 3.0 |
| nitrogen | 0.01– 0.5 |
| including: aluminum and silicon oxides, carbides, nitrides and phosphides | 0.01– 5.0 |

2. A method for preparing a ferromagnetic abrasive material comprising:
   melting an iron-aluminum-silicon-phosphorus alloy; adding carbon to said melt; overheating the melt containing iron, aluminum, silicon, phosphorus, carbon above the temperature corresponding to the solidification temperature by 50°–200° C.; atomizing a jet of the melt containing Fe, Al, Si, P, C to obtain pellets of a size smaller than 1.5 mm with a gas jet at a pressure from 2 to 20 atm. and gas velocity from 150 to 500 m/s, the gas jet containing from 99.999 to 75% by weight of nitrogen and from 0.001 to 25% by weight of oxygen; and cooling the resultant pellets.

3. A pellet formed of the material of claim 1 in which the ferromagnetic component is disposed within the central portion of said pellet and the abrasive component is disposed on the periphery of the ferromagnetic component.

4. The pellet of claim 3 having a spherical shape.

5. The pellet of claim 3 having an elongate splinter-like shape.

6. A method for preparing a ferromagnetic abrasive pellet having a centrally disposed ferromagnetic component and a peripherally disposed abrasive component said method comprising the steps of melting an iron-aluminum-silicon-phosphorus alloy; adding carbon to the melt; heating the resultant melt to a temperature from about 50° to 200° C. above the solidification temperature of the melt; atomizing the melt with a gas jet containing nitrogen and oxygen to obtain pellets having a size less than 1.5 mm; and cooling the resultant pellets whereby aluminum and silicon oxides, nitrides, carbides and phosphides are formed on the surface of said pellets.

7. The method of claim 6 wherein the gas jet is operated at a pressure of from about 2 to 20 atm. and a gas velocity from 150 to 500 m/s, the gas jet containing from about 99.999 to 75% by weight of nitrogen and from about 0.001 to 25% by weight of oxygen.

* * * * *